(12) United States Patent
Kwon et al.

(10) Patent No.: US 11,800,757 B2
(45) Date of Patent: Oct. 24, 2023

(54) DISPLAY PANEL AND DISPLAY DEVICE

(71) Applicant: LG Display Co., Ltd., Seoul (KR)

(72) Inventors: WonJu Kwon, Paju-si (KR); KeunYoung Son, Paju-si (KR); JaeHyun Jin, Paju-si (KR); ByungJun Lim, Paju-si (KR); TaeRyong Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 327 days.

(21) Appl. No.: 17/134,451

(22) Filed: Dec. 27, 2020

(65) Prior Publication Data

US 2021/0202668 A1   Jul. 1, 2021

(30) Foreign Application Priority Data

Dec. 30, 2019   (KR) .................. 10-2019-0177824

(51) Int. Cl.
*H10K 59/131* (2023.01)
*H10K 59/122* (2023.01)
*H10K 59/124* (2023.01)
*H10K 102/00* (2023.01)

(52) U.S. Cl.
CPC ......... *H10K 59/131* (2023.02); *H10K 59/122* (2023.02); *H10K 59/124* (2023.02); *H10K 2102/311* (2023.02)

(58) Field of Classification Search
CPC ............. H01L 27/3258; H01L 27/3276; H01L 27/3246; H01L 51/5246; H01L 51/0031; H10K 59/131; H10K 59/122; H10K 59/124; H10K 2102/311; H10K 50/8426; H10K 71/70
See application file for complete search history.

(56) References Cited

U.S. PATENT DOCUMENTS

| | | | |
|---|---|---|---|
| 2016/0190179 A1* | 6/2016 | Kim ...................... G02F 1/1345 | 257/774 |
| 2016/0307971 A1* | 10/2016 | Jeon ...................... G09G 3/3233 | |
| 2018/0158741 A1* | 6/2018 | Kim ........................ H01L 22/32 | |
| 2019/0157607 A1* | 5/2019 | Kim ...................... H10K 77/111 | |
| 2020/0161406 A1* | 5/2020 | Lee ..................... G01R 31/2632 | |

* cited by examiner

*Primary Examiner* — Vongsavanh Sengdara
(74) *Attorney, Agent, or Firm* — POLSINELLI PC

(57) ABSTRACT

A display device includes a display panel including an active area and a non-active area surrounding the active area; a front cover disposed in an upper portion of the display panel; a back cover disposed in a lower portion of the display panel; a dam disposed to surround an outer periphery of the active area in the non-active area of the display panel; a pad area spaced apart from the dam in the non-active area and disposed in an edge of one side of the non-active area; at least one inspection line spaced apart from the dam in the non-active area and disposed to surround a portion of an outer periphery of the dam; and at least one align mark integral with the inspection line.

19 Claims, 7 Drawing Sheets

DISPLAY PANEL AND DISPLAY DEVICE

CROSS-REFERENCE TO RELATED APPLICATION

This application claims priority from Korean Patent Application No. 10-2019-0177824, filed on Dec. 30, 2019, which is hereby incorporated by reference in its entirety.

BACKGROUND

Field of the Disclosure

Aspects of present disclosure relate to a display panel and a display device, and more particularly, provide a display panel and a display device capable of reducing an area of a bezel area.

Description of the Background

With the development of the information society, demands for display device for displaying image are increasing in various forms, and in recent years, various display devices, such as liquid crystal display (LCD), plasma display panel (PDP), an organic light emitting display device (OLED), are used.

Such a display device may include components disposed in upper and lower portions of a display panel to protect the display panel.

An align mark for recognizing the position of each component may be disposed in the display panel, when the display panel and the components disposed in the upper and lower portions of the display panel are bonded.

SUMMARY

An align mark may be disposed in a non-active area (or bezel area) of a display panel, and the area occupied by the align mark in the non-active area may be increased due to a design condition or the like for improving visibility of the align mark.

Accordingly, the area of the non-active area is also increased. Recently, there is an increasing demand to reduce the size of the non-active area to secure the maximum area of the active area of the display panel. Accordingly, the inventors of present disclosure have invented a new structure of a display panel and a display device capable of minimizing an increase in the area of non-active area caused by align mark.

The present disclosure is to provide a display panel and a display device having a low area increase rate of a non-active area even if an align mark is disposed in the non-active area of the display panel.

The present disclosure is to provide a display panel and a display device having a simple process of manufacturing an align mark.

A display device having a non-active area of a small area through an align mark according to an aspect of the present disclosure is provided. The display device according to an aspect of present disclosure includes a display panel including an active area and a non-active area surrounding the active area; a front cover disposed in an upper portion of the display panel; a back cover disposed in a lower portion of the display panel; a dam disposed to surround an outer periphery of the active area in the non-active area of the display panel; a pad area spaced apart from the dam in the non-active area and disposed in an edge of one side of the non-active area; at least one inspection line spaced apart from the dam in the non-active area and disposed to surround a portion of an outer periphery of the dam; and at least one align mark integral with the inspection line.

A display panel having a non-active area of a small area through an align mark according to an aspect of present disclosure is provided. The display panel according to the aspect of present disclosure includes a dam disposed to surround an outer periphery of the active area in the non-active area of the substrate; a pad area spaced apart from the dam in the non-active area and disposed in an edge of one side of the non-active area; at least one inspection line spaced apart from the dam in the non-active area and disposed to surround a portion of an outer periphery of the dam; and at least one align mark integral with the inspection line.

According to the aspects of present disclosure, at least one inspection line and align mark disposed in a non-active area are integrally formed, thereby minimizing the area occupied by the align mark in the non-active area.

According to the aspects of present disclosure, at least one inspection line and align mark disposed in a non-active area are integrally formed, thereby simplifying the process of forming the align mark.

BRIEF DESCRIPTION OF THE DRAWINGS

The above and other features and advantages of the present disclosure will be more apparent from the following detailed description in conjunction with the accompanying drawings, in which.

DETAILED DESCRIPTION

Figure 1:
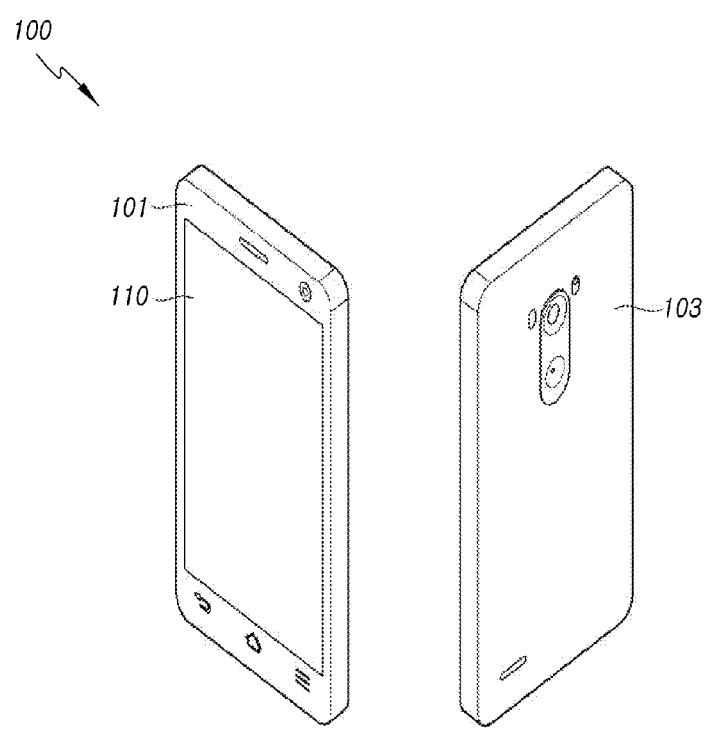
FIG. 1 is a diagram schematically illustrating a display device according to aspects of present disclosure.

Advantages and features of the present disclosure and methods for achieving them will be made clear from the aspects described below in detail with reference to the accompanying drawings. The present disclosure may, however, be embodied in many different forms and should not be construed as being limited to the aspects set forth herein. Rather, these aspects are provided so that this disclosure will be thorough and complete, and will fully convey the scope of the disclosure to those skilled in the art. The present disclosure is defined only by the scope of the claims.

Since the shapes, sizes, ratios, angles, and numbers disclosed in the drawings for describing the aspects of present disclosure are exemplary, present disclosure is not limited to the illustrated matters. Like reference numerals refer to like elements throughout the specification. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

In interpreting the elements, it is interpreted as including the error range even if there is no explicit description.

Spatially relative terms should be understood in terms of the directions shown in the drawings, including the different directions of components at the time of use or operation. For example, when inverting an element shown in the drawings, an element described as "below" or "beneath" of another element may be placed "above" of another element.

Expressions such as "first" and "second" represent various constituent elements regardless of orders and/or importance. One constituent element is used to be distinguished from other constituent elements but does not limit corresponding constituent elements. Accordingly, the first constituent element mentioned below may be the second constituent element within the technical spirit of present disclosure.

Each of the features of the various aspects of present disclosure may be partially or totally coupled or combined with each other, and various interlocking and driving may be technically possible, and each of the aspects may be independently implemented with respect to each other or implemented together in an associative relationship.

Hereinafter, various configurations of a display device including an align mark structure according to an aspect of present disclosure will be described.

A configuration of a display panel and a display device of present disclosure includes a display panel including an active area and a non-active area surrounding the active area; a front cover disposed in an upper portion of the display panel; a back cover disposed in a lower portion of the display panel; a dam disposed to surround an outer periphery of the active area in the non-active area of the display panel; a pad area spaced apart from the dam in the non-active area and disposed in an edge of one side of the non-active area; at least one inspection line spaced apart from the dam in the non-active area and disposed to surround a portion of an outer periphery of the dam; and at least one align mark integral with the inspection line.

According to the configuration of the display panel and the display device of present disclosure, a plurality of pads are disposed in the pad area, and the inspection line is electrically connected to the pad.

According to the configuration of the display panel and the display device of present disclosure, the inspection line comprises a first inspection line disposed to surround the portion of the outer periphery of the dam and a second inspection line spaced apart from the first inspection line and disposed to surround an outer periphery of the first inspection line.

According to the configuration of the display panel and the display device of present disclosure, the at least one align mark is integral with the second inspection line.

According to the configuration of the display panel and the display device of present disclosure, the non-active area comprises at least one crack prevention line disposed in an outer periphery of the second inspection line.

According to the configuration of the display panel and the display device of present disclosure, at least one thin film transistor is disposed on the substrate of the active area, the thin film transistor comprises a gate electrode, an active layer, a source electrode, and a drain electrode disposed on the substrate, and the first inspection line and the second inspection line are disposed on the same layer as the gate electrode.

According to the configuration of the display panel and the display device of present disclosure, the align mark is disposed on the same layer as the gate electrode of the thin film transistor.

According to the configuration of the display panel and the display device of present disclosure, the second inspection line comprises at least one groove.

According to the configuration of the display panel and the display device of present disclosure, the groove of the second inspection line comprises a first portion extended in a first direction, a second portion extended in a second direction intersecting the first direction in from the first portion, and a third portion extended in a direction corresponding to a direction in which the first portion is extended in from the second portion.

According to the configuration of the display panel and the display device of present disclosure, the align mark is integral with at least one of the first to third portions of the second inspection line.

According to the configuration of the display panel and the display device of present disclosure, a width of the align mark with respect to a direction in which a long short side of the display panel is extended corresponds to a depth of the groove, or is wider than the depth of the groove.

According to the configuration of the display panel and the display device of present disclosure, a maximum width of the align mark with respect to a direction in which a short side of the display panel is extended is larger than a maximum width of a signal line disposed in the non-active area.

According to the configuration of the display panel and the display device of present disclosure, the align mark comprises at least two portions having an angle of 90 degrees or more.

Hereinafter, various aspects of present disclosure will be described in detail with reference to the accompanying drawings.

FIG. 1 is a diagram schematically illustrating a display device according to aspects of present disclosure.

A display device 100 according to the aspects of present disclosure may include a front cover 101, a back cover 103, and a display panel 110.

The front cover 101 may include a cover glass covering the display panel 110. The front cover 101 may overlap a part of the upper surface of the display panel 110.

An image may be displayed on the upper surface of the display panel 110 exposed by the front cover 101.

Meanwhile, when the display device 100 according to the aspects of present disclosure is a mobile terminal, a front camera and various sensors may be disposed in the front surface of the mobile terminal. In addition, a rear camera and various sensors may be disposed in the rear surface of the back cover 103. Sensors may be various sensors which are applicable to mobile terminal, for example, may be proximity sensor, gyro sensor, geomagnetic sensor, motion sensor, illuminance sensor, RGB sensor, hall sensor, temperature/humidity sensor, heart rate sensor, fingerprint sensor, and the like.

Although not shown in the drawing, the display device 100 according to aspects of the present disclosure may further include a configuration such as a middle frame, a main board, and a battery.

Here, the middle frame may serve to support the display panel 110 at the rear surface of the display panel 110. In addition, the main board may be configured to be connected to a user input unit, a speaker, a microphone, a battery, and the like.

Touch sensors may be disposed on the entire screen of the display panel 110. In addition, aspects according to the present disclosure are not limited thereto, and a touch panel may be additionally disposed on the display panel 110.

As described above, the display panel 110 according to the aspects of present disclosure may have a structure combined with at least two components. For example, the display panel 110 may be combined with the front cover 101, the back cover 103, and the cover glass.

In order to combine the display panel 110, with the front cover 101, the back cover 103, and the cover glass, each component must be disposed at an appropriate position.

To this end, the display panel 100 may include at least one align mark. The align mark may be used as an identification mark for align in the process of bonding the display panel 110 and other components.

The display device 100 of present disclosure may be a liquid crystal display (LCD), an organic light emitting display, or the like. The display device 100 includes the display panel 110 and a driving circuit for driving the display panel 110.

Figure 2:
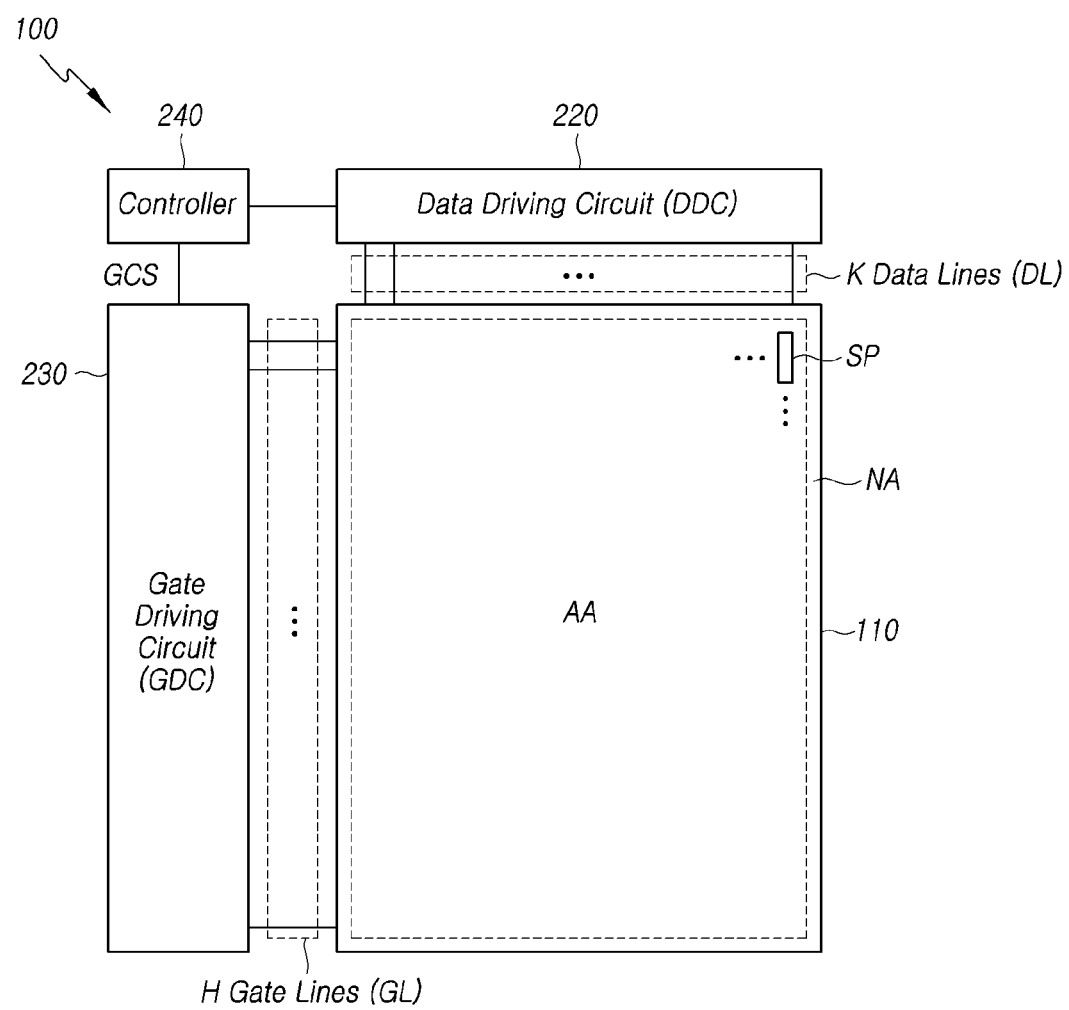
FIG. 2 is a schematic configuration diagram of a display device according to aspects of present disclosure.

FIG. 2 is a schematic configuration diagram of a display device according to aspects of present disclosure.

The display device 100 according to aspects of present disclosure may include a display panel 110, a data driving circuit 220, a gate driving circuit 230, a controller 240, and the like.

K data lines DL and H gate lines GL are disposed on the display panel 110. K is a natural number that is equal to or greater than 2, and H is a natural number that is equal to or greater than 2.

In addition, a plurality of subpixels SP defined by K data lines DL and H gate lines GL may be disposed in the display panel 110. The plurality of subpixels SP may be disposed in a matrix type, but aspects according to present disclosure are not limited thereto.

The display panel 110 may include an active area AA in which a picture (image) is displayed, and a non-active area NA which is a peripheral area thereof and in which a picture is not displayed. Here, the non-active area NA is also called a bezel area.

A plurality of subpixels SP for displaying a picture are disposed in the active area (A/A). Each sub-pixel (SP) may include at least one emission area.

In the non-active area NA, a pad area for electrically connecting a data driving circuit 220 is disposed, and a plurality of data link lines (or signal lines) for connection between the pad area and the plurality of data lines are disposed.

The data driving circuit 220 is a circuit that drives K data lines DL for displaying an image, and outputs an image data voltage corresponding to an image signal to the K data lines DL.

The gate driving circuit 230 is a circuit that sequentially drives H gate line GL so as to display an image, and may sequentially supply a gate signal (scan signal) to H gate line GL so as to display an image.

The controller 240 is a component for controlling the data driving circuit 220 and the gate driving circuit 230, and provides various control signals (data driving control signal, gate driving control signal, etc.) to the data driving circuit 220 and the gate driving circuit 230.

The controller 240 starts scanning according to the timing implemented in each frame, converts the input image data input from the outside according to a data signal format used by the data driving circuit 220, then outputs the converted image data, and controls data driving at a suitable time according to scan.

The controller 240 may be a timing controller used in a conventional display technology or a control device that includes a timing controller to further perform other control functions.

The data driving circuit 220 is located only in one side (e.g. the upper side or the lower side) of the display panel 110 in FIG. 2, but may be located in both sides (e.g. the upper side and the lower side) of the display panel 110 according to a driving method, a panel design method, or the like.

The data driving circuit 220 may be configured to include at least one source driver integrated circuit (SDIC).

Each source driver integrated circuit (SDIC) may be connected to a bonding pad of the display panel 110 according to a tape automated bonding (TAB) method or a chip on glass (COG) method, or may be disposed directly in the display panel 110. In some cases, it may be integrated and disposed in the display panel 110. In addition, each source driver integrated circuit (SDIC) may be implemented in a chip on film (COF) method mounted on a film connected to the display panel 110.

Each source driver integrated circuit (SDIC) may include a shift register, a latch circuit, a digital to analog converter (DAC), an output buffer, and the like.

Each source driver integrated circuit (SDIC) may, in some cases, further include an analog to digital converter (ADC).

The gate driving circuit 230 is located only in one side (e.g. the left side or the right side) of the display panel 110 in FIG. 2, but may be located in both sides (e.g. the upper side and the lower side) of the display panel 110 according to a driving method, a panel design method, or the like.

The gate driving circuit 230 may be configured to include at least one gate driver integrated circuit (GDIC).

Each gate driver integrated circuit (GDIC) may be connected to a bonding pad of the display panel 110 according to a tape automated bonding (TAB) method or a chip on glass (COG) method, or may be implemented in a gate in panel (GIP) type to be disposed directly in the display panel 110. In some cases, it may be integrated and disposed in the display panel 110. In addition, each gate driver integrated circuit (GDIC) may be implemented in a chip on film (COF) method mounted on a film connected to the display panel 110.

Each gate driver integrated circuit (GDIC) may include a shift register, a level shifter, and the like.

Each sub-pixel (SP) disposed in the display panel 110 may be configured to include a circuit element such as a transistor.

The type and number of circuit element constituting each pixel may be variously determined according to a provided function, a design method, and the like.

Figure 3:
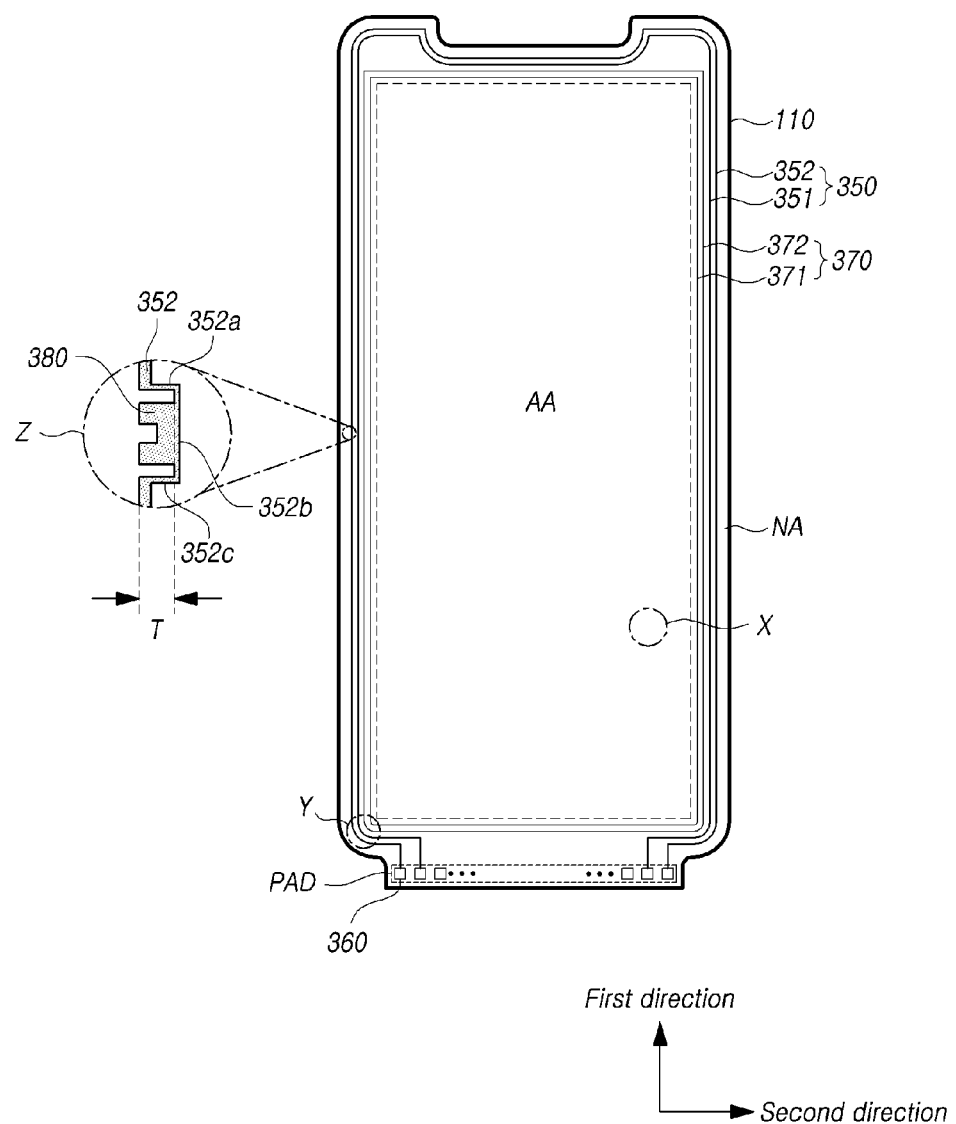
FIG. 3 is a plan view schematically illustrating a structure of a display panel of a display device according to aspects of present disclosure.
Figure 4:
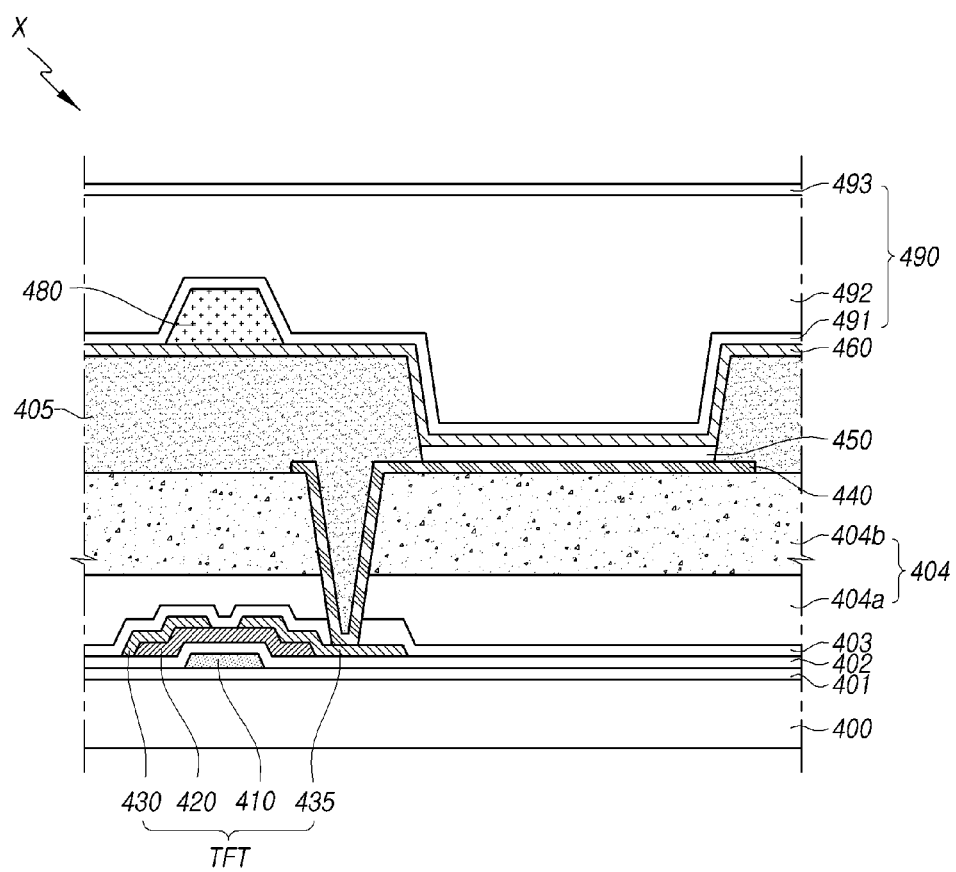
FIG. 4 is an enlarged view of X area (part of an active area) of FIG. 3.
Figure 5:
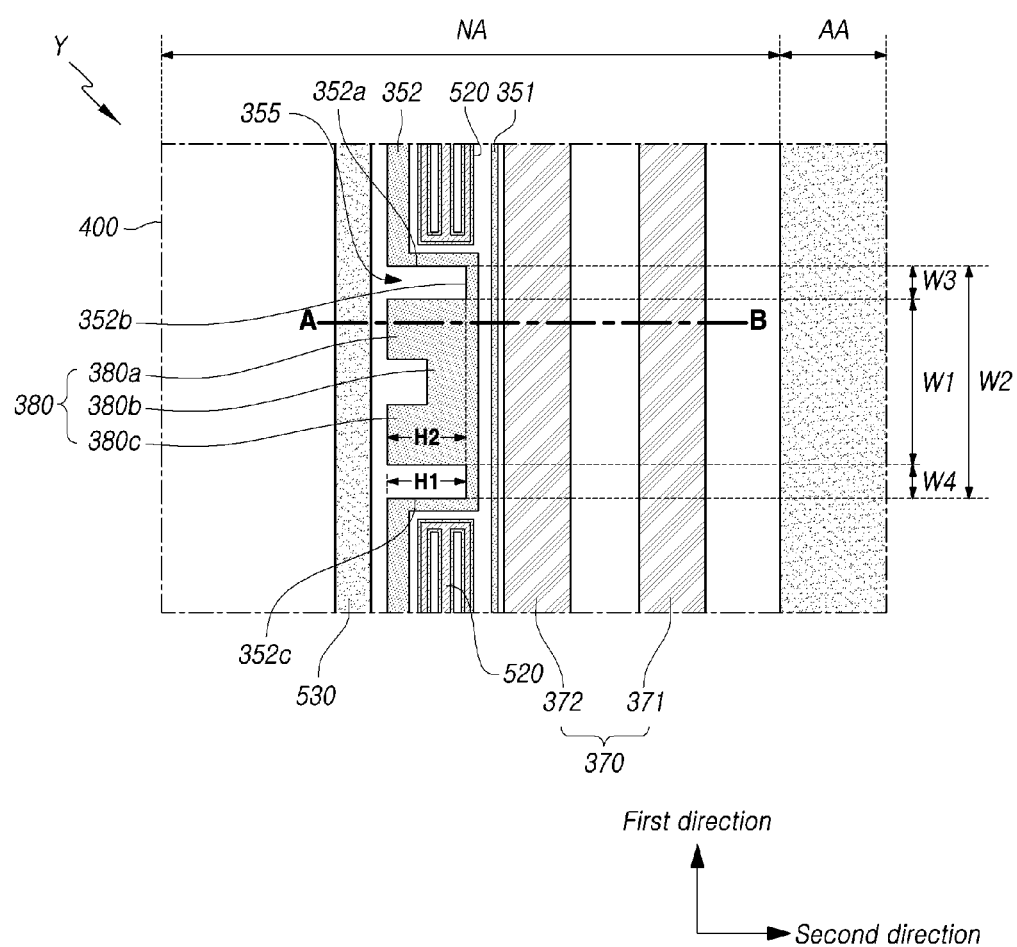
FIG. 5 is an enlarged view of Y area (part of a non-active area) of FIG. 3.

FIG. 3 is a plan view schematically illustrating a structure of a display panel of a display device according to aspects of present disclosure. FIG. 4 is an enlarged view of the X area (part of an active area) of FIG. 3. FIG. 5 is an enlarged view of the Y area (part of a non-active area) of FIG. 3.

Referring to FIG. 3, the display panel 110 may include an active area AA displaying a picture and a non-active area NA surrounding the outer periphery of the active area AA.

A plurality of subpixels SP for displaying a picture are disposed in the active area AA. Each sub-pixel (SP) may include at least one emission area. In addition, a non-emission area (NEA) surrounding the emission area (EA) may be disposed in the active area AA.

Referring to FIG. 4, at least one thin film transistor (TFT) and an organic light emitting diode (OLED) may be disposed on a substrate 400. An encapsulation layer 490 for protecting the organic light emitting diode (OLED) from foreign substances (including moisture and oxygen) may be disposed on the organic light emitting diode (OLED).

The thin film transistor (TFT) may include a gate electrode 410, an active layer 420, a source electrode 430, and a drain electrode 435.

The organic light emitting diode (OLED) may include a first electrode 440, an organic layer 450, and a second electrode 460.

Specifically, at least one buffer layer 401 may be disposed on the substrate 400. In some cases, the buffer layer 401 may be omitted. Alternatively, the buffer layer 401 may have a structure in which a plurality of thin films are deposited. In this case, it may have a structure in which a plurality of inorganic films are stacked, but present disclosure is not limited thereto.

The buffer layer 401 may be formed of an inorganic material such as silicon oxide (SiOx), silicon nitride (SiNx), or silicon oxynitride (SiON), but present disclosure is not limited thereto.

When the buffer layer 401 is a multi-layer film, it may be a structure in which at least two inorganic material layers, among inorganic materials such as silicon oxide (SiOx), silicon nitride (SiNx), or silicon oxynitride (SiON), are alternately disposed. However, present disclosure is not limited thereto.

In the following description, for convenience, the buffer layer 401 will be described as a single layer structure.

A gate electrode 410 may be disposed on the buffer layer 401.

The gate electrode 410 may include metal such as silver (Ag), aluminum (Al), magnesium (Mg), chromium (Cr), titanium (Ti), nickel (Ni), tungsten (W), gold (Au), tantalum (Ta), copper (Cu), cobalt (Co), iron (Fe), molybdenum (Mo), and platinum (Pt), or alloy thereof, but present disclosure is not limited thereto.

Meanwhile, although the gate electrode 410 is illustrated as a single layer structure in FIG. 4, present disclosure is not limited thereto. For example, the gate electrode 410 may be formed of a multi-layer structure of two or more layers. Examples of the multi-layer are a double film of a lower layer such as titanium (Ti), tantalum (Ta), molybdenum (Mo), ITO, and an upper layer of copper (Cu), and a triple layer of molybdenum (Mo)-aluminum (Al)-molybdenum (Mo).

A gate insulating layer 402 may be disposed on the gate electrode 410.

The gate insulating layer 402 may be formed of an inorganic material such as silicon oxide (SiOx), silicon nitride (SiNx), or silicon oxynitride (SiON), but present disclosure is not limited thereto.

An active layer 420 overlapped with the gate electrode 410 may be disposed on the gate insulating layer 402.

The active layer 420 may be various types of semiconductor layers.

For example, the active layer 420 may be any one of an oxide semiconductor, an amorphous silicon semiconductor, or a polycrystalline silicon semiconductor, but present disclosure is not limited thereto.

A source electrode 430 and a drain electrode 435 disposed spaced apart from each other may be disposed on the active layer 420.

The source electrode 430 and the drain electrode 435 may include metal such as silver (Ag), aluminum (Al), magnesium (Mg), chromium (Cr), titanium (Ti), nickel (Ni), tungsten (W), gold (Au), tantalum (Ta), copper (Cu), cobalt (Co), iron (Fe), molybdenum (Mo), and platinum (Pt), or an alloy thereof, but present disclosure is not limited thereto.

A protective layer 403 may be disposed on the source electrode 430 and the drain electrode 435.

The protective layer 403 may be formed of an inorganic material such as silicon oxide (SiOx), silicon nitride (SiNx), or silicon oxynitride (SiON), but present disclosure is not limited thereto.

A planarization layer 404 may be disposed on the protective layer 403. The planarization layer 404 may include a first planarization layer 404a disposed on the protective layer 403 and a second planarization layer 404b disposed on the first planarization layer 404a, but the structure of the present aspect Is not limited thereto, and the planarization layer 404 may be formed of a single layer or three or more layers.

The planarization layer 404 may include an organic material capable of planarizing the substrate 400, but present disclosure is not limited thereto.

A first electrode 440 of the organic light emitting diode (OLED) may be disposed on the planarization layer 404. Here, the first electrode 440 may be an anode of the organic light emitting diode (OLED), but present disclosure is not limited thereto.

The first electrode 440 may be electrically connected to the drain electrode 435 of the thin film transistor (TFT) through a contact hole provided in the planarization layer 404 and the protective layer 403.

FIG. 4 illustrates a configuration in which the first electrode 440 is in contact with the drain electrode 435, but present disclosure is not limited thereto. For example, the first electrode 440 may be electrically connected to the source electrode 430 of the thin film transistor (TFT) instead of the drain electrode 435.

The first electrode 440 may be an electrode including a transparent conductive material.

For example, the first electrode 440 may include at least one of indium tin oxide (ITO), indium zinc oxide (IZO) or indium tin zinc oxide (ITZO), but present disclosure is not limited thereto.

The first electrode 440 may be a reflective electrode. For example, the first electrode 440 may be any one element selected from a group including silver (Ag), aluminum (Al), magnesium (Mg), chromium (Cr), titanium (Ti), nickel (Ni), tungsten (W), gold (Au), tantalum (Ta), copper (Cu), cobalt (Co), iron (Fe), molybdenum (Mo), and platinum (Pt), or may be an alloy of the metals.

In addition, although the configuration in which the first electrode 440 is a single layer is illustrated in FIG. 4, present disclosure is not limited thereto, and the first electrode 440 may be formed of multiple layers.

Meanwhile, although not illustrated in the drawing, at least one auxiliary electrode may be disposed between the first planarization layer 404a and the second planarization layer 404b or on the same layer as the first electrode 440.

The auxiliary electrode is an electrode electrically connected to the second electrode 460 of the organic light emitting diode (OLED), and may serve to prevent a voltage drop by the second electrode 460.

The bank 405 may be disposed on a portion of the upper surface of the first electrode 440 and a portion of the upper surface of the planarization insulating layer 404.

The bank 405 may serve to define a plurality of light emitting areas (EA) and non-light emitting areas (NEA) in the active area AA. Specifically, an area in which the bank 405 is not disposed in the active area AA may be the light emitting area (EA), and an area in which the bank 405 is disposed may be the non-light emitting area (NEA).

At least one spacer 480 may be disposed on the bank 405. The spacer 480 may serve as a support portion capable of supporting the mask in the process of forming the organic layer 450 of the organic light emitting diode (OLED).

Meanwhile, FIG. 4 illustrates a structure in which at least one spacer 480 is disposed on the bank 405, but the structure according to the present aspect is not limited thereto, and the spacer 408 may not be disposed on the bank 405.

An organic layer 450 including at least one light emitting layer may be disposed on the upper surface of the first electrode 440 that is not overlapped with the bank 405.

Meanwhile, although FIG. 4 illustrates a structure in which the organic layer 450 is disposed only on the upper surface of the first electrode 440 that is not overlapped with the bank 405, present disclosure is not limited thereto.

For example, the organic layer 450 may be disposed on the first electrode 440 and the bank 405 in the active area (A/A).

However, in the following description, for convenience of description, the structure in which the organic layer 450 is disposed on the upper surface of the first electrode 440 that is not overlapped with the bank 405 will be mainly described.

The second electrode 460 of the organic light emitting diode (OLED) may be disposed on the organic layer 450. Here, the second electrode 460 may be a cathode of the organic light emitting diode (OLED), but present disclosure is not limited thereto.

The second electrode 460 may be an electrode including a transparent conductive material. For example, the second electrode 460 first electrode 440 may include at least one of indium tin oxide (ITO), indium zinc oxide (IZO), or indium tin zinc oxide (ITZO), but present disclosure is not limited thereto.

The second electrode 460 may be a semi-transmissive electrode or a reflective electrode. For example, the second electrode 460 may be any one element selected from a group including silver (Ag), aluminum (Al), magnesium (Mg), chromium (Cr), titanium (Ti), nickel (Ni), tungsten (W), gold (Au), tantalum (Ta), copper (Cu), cobalt (Co), iron (Fe), molybdenum (Mo), and platinum (Pt), or may be an alloy of the metals.

The second electrode 460 may be disposed on the entire surface of the active area (A/A), but present disclosure is not limited thereto. For example, the second electrode 460 may be disposed only in a part of the active area (A/A).

An encapsulation layer 490 for protecting the organic light emitting diode (OLED) from moisture and oxygen may be disposed on the second electrode 460.

The encapsulation layer 490 may include a first encapsulation layer 491, a second encapsulation layer 492, and a third encapsulation layer 493 disposed on the second electrode 460. Meanwhile, although FIG. 4 illustrates that the encapsulation layer 490 has a multi-layer structure, aspects of the present disclosure are not limited thereto. For example, the encapsulation layer 490 may be a single layer. However, in the following description, for convenience of description, it will be mainly described that the encapsulation layer 490 has a multi-layer structure.

The first encapsulation layer 491 and the third encapsulation layer 493 may include an inorganic insulating material, and the second encapsulation layer 492 may include an organic insulating material.

In addition, referring to FIG. 3, a pad area PAD, a dam 120370, at least one inspection line 350, and at least one align mark 380 are disposed in the non-active area NA included in the display panel 110 of the display device 100 of present disclosure.

The pad area PAD may be disposed in one edge of the display panel. The pad area PAD may include a plurality of pads 360. The plurality of pads 360 may be electrically connected to the data driving circuit 220 through another film using a film (e.g. an anisotropic conductive film, etc.).

The dam 370 may include a first dam 371 and a second dam 372. The first dam 371 and the second dam 372 may be disposed to surround the active area AA, and at least one of the first dam 371 and the second dam 372 may block the flow of the second encapsulation layer 492 (see FIG. 4) disposed in the display panel 110. Specifically, the first dam 371 and the second dam 372 are disposed between the active area AA and the pad area (PAD) to block the second encapsulation layer 492 from invading the pad area (PAD).

In addition, the inspection line 350 may be disposed to be spaced apart from the first and second dams 371 and 372 in the non-active area NA. For example, the first dam 371 may be disposed to surround the active area AA, and the second dam 372 may be disposed to surround the outer periphery of the first dam 371.

In addition, the inspection line 350 may be disposed to surround a part of the outer periphery of the second dam 372. For example, the inspection line 350 is disposed to surround the outer periphery of the second dam 372, but may not be disposed in a part of one side of the display panel 110 in which the pad area (PAD) is disposed.

The inspection line 350 may include a first inspection line 351 surrounding a part of the outer periphery of the second dam 372 and a second inspection line 352 surrounding the outer periphery of the first inspection line 351.

Meanwhile, FIG. 3 shows a structure in which there are two inspection lines 350 for detecting a crack in the non-active area NA, but the structure of the display panel 110 according to aspects of present disclosure is not limited thereto. The display panel 110 may include one or three or more inspection lines 350 disposed in the non-active area NA.

A part of the non-active area NA of the display panel 110 may be provided with a bending area. When a large external force is applied to the display panel 110 in bending of the display panel 110, a plurality of signal lines disposed in the non-active area NA may be damaged.

The inspection line 350 is a configuration that can determine whether a plurality of signal lines are damaged due to an external force applied to the non-active area NA.

The inspection line 350 may be electrically connected to the pad 360 disposed in the pad area (PAD). In addition, when damage such as a crack occurs in the non-active area NA, a crack may be applied to the inspection line 350. As described above, when the inspection line 350 is damaged, the resistance of the inspection line 350 increases, thereby detecting the occurrence of crack in the non-active area NA.

Specifically, after the current according to a reference voltage flows along the inspection line 350, the output voltage is detected, and it is possible to determine whether the display panel 110 is damaged, through a detection result signal based on whether the detected output voltage is within a reference voltage range or not within the reference voltage range.

At least one align mark 380 is disposed in the non-active area NA of the display panel 110.

For example, the align mark 380 may exist in at least one corner portion of the display panel 110 on a plane, and may also be disposed in at least one side according to the size of the display panel 110.

The display panel 110, a front cover, a back cover, a cover glass, and the like may be aligned within an error range through the align mark 380. When the components included in the display device 100 are misaligned, the bonding of the components included in the display device 100 may be difficult, and in some components, failure, such as covering the active area AA in which the image of the display panel 110 is displayed, may occur.

Therefore, in order to prevent misalignment of the components included in the display device 100, the identifiability of the align mark 380 must be high.

However, when the align mark 380 is disposed in the non-active area NA, the area of the non-active area NA with respect to the amount occupied by the align mark 380 may be increased. Therefore, there is a difficulty in reducing the area of the non-active area NA.

In addition, when the size of the align mark 380 is reduced so as to reduce the area of the non-active area NA, the identification of the align mark 380 may be difficult.

The display panel 110 according to the aspect of present disclosure has a structure of align mark 380 which has an excellent identifiability, and can minimize the area of the non-active area NA.

The align mark 380 disposed in the non-active area NA may have a complicated shape, or may have a width greater than the width of the signal lines in order to be discriminated differently from other signal lines disposed in the non-active area NA. Here, the maximum width T of the align mark 380 and the maximum width of the signal lines may be one side of the display panel 110 having a short length on a plane, that is, the shortest straight line length in the direction in which the short side of the display panel 110 is extended.

Referring to FIGS. 3 and 5, the align mark 380 disposed in the non-active area NA may be integral with at least one inspection line 350.

For example, the align mark 380 may be integral with the second inspection line 352 which is the inspection line 350 disposed in the outermost side of the display panel 110. In other words, the inspection line 350 disposed farthest from the active area AA and the align mark 380 may be integrated.

Through this, visibility of the align mark 380 may be increased, but the structure of present disclosure is not limited thereto. For example, at least one align mark 380 may be integral with the first inspection line 351.

The second inspection line 352 may include at least one groove 355 on a plane to secure a space for the align mark 380 to be located.

Here, the entrance of the groove 355 of the second inspection line 352 may be disposed to face a crack prevention line 530 disposed in the non-active area NA.

The groove 355 of the second inspection line 352 may be formed through a first portion 352a extended in a second direction that is a direction intersecting a first direction from an area where the second inspection line 352 is extended in the first direction (e.g. a direction in which one side having a long length of the display panel 110 is extended), a second portion 352b extended in a first direction from the first portion 352a, and a third portion 352c extended in the same direction as the direction in which the first portion 352a is extended from the second portion 352b.

In addition, at least one align mark 380 may be disposed in the groove 355 provided in the second inspection line 352.

The align mark 380 may be integral with the second portion 352b of the second inspection line 352.

However, the structure in which the align mark 380 is integral with the second portion 352b of the second inspection line 352 is just an example, and the structure according to the aspect of present disclosure is not limited thereto. The align mark 380 may have a structure integral with at least one of the first to third portions 352a, 352b, and 352c of the second inspection line 352.

As an example of the shape of the align mark 380, the align mark 380 may include a first area 380a, a second area 380b, and a third area 380c.

The first to third areas 380a, 380b, and 380c are extended in the first direction, and may be integrally formed with each other. Here, the second area 380b may be disposed between the first area 380a and the third area 380c. In addition, each of the first to third areas 380a, 380b, and 380c may have a rectangular shape on a plane.

The heights of the first and third areas 380a, 380c correspond to each other, and the height of the second area 280b 380b may be lower than the heights of the first and third areas 380a, 380c. Here, each of the heights of the first to third areas 380a, 380b, and 380c may mean the minimum length based on a direction corresponding to the direction in which the first and third portions 352a, 352c of the second inspection line 352 are extended.

In other words, the shape of the align mark 380 may be a shape corresponding to 凹. As described above, the align mark 380 may have a shape in which a plurality of portions having an angle of 90 degrees or more are exist on a plane. The visibility of the align mark 380 may be enhanced when a portion having an angle of 90 degrees or more exists in comparison with a case where a portion having a curve, such as a circular or elliptical shape, exists. The visibility of the align mark 380 according to the present aspect can be improved, as a large number of portions having an angle of 90 degrees or more exist.

Meanwhile, FIG. 3 and FIG. 5 show that the align mark 380 is in a shape of 凹, but the shape of the align mark 380 according to present disclosure is not limited thereto. For example, the alignment mark 380 may be a polygonal shape such as a square, pentagon, or hexagon. In the aspect of present disclosure, a shape having at least two parts having an angle of 90 degrees or more is sufficient to improve the visibility of the alignment mark 380.

A depth H1 of the groove 355 of the second inspection line 352 based on the second direction may correspond to or be lower than the first width H2 of the align mark 380. When a first width H2 of the align mark 380 is lower than the depth H1 of the groove 355 of the second inspection line 352, visibility of the align mark 380 may be difficult.

Here, the depth H1 of the groove 355 of the second inspection line 352 may be a minimum length from one side of the first portion 352a located farthest from the active area AA of the second inspection line 352 to the one side of the second portion 352b located farthest from the active area AA. In addition, the first width H2 of the align mark 380 may be a minimum length from one side of the align mark 380 located farthest from the active area AA to one side of the align mark 380 located closest to the active area AA (Here, the width of the area corresponding to the second portion 352b is excluded).

In addition, the second width W1 of the align mark 380 may be equal to or more than half of the width W2 of the groove 355 of the second inspection line 352. Here, each of the second width W1 of the align mark 380 and the width W2 of the groove 355 of the second inspection line 352 may be a minimum length in a direction corresponding to the direction in which the second portion 352b of the second inspection line 352 is extended.

Meanwhile, as shown in FIG. 5, the align mark 380 is disposed in the groove 355 of the second inspection line 352, and may have a structure in which the align mark 380 and the first and third portions 352a, 352c of the second inspection line 352 are disposed apart from each other in the groove 355.

At this time, the sum of the width W3 of the area between the alignment mark 380 and the first portion 352a and the width W4 of the area between the alignment mark 380 and the third portion 352c may be smaller than the second width W1 of the alignment mark 380. The width W3 of the area between the alignment mark 380 and the first portion 352a and the width W4 of the area between the alignment mark 380 and the third portion 352c may correspond to each other, but the present aspect is not limited thereto.

Thus, the area in which the align mark 380 is disposed in the groove 355 of the second inspection line 352 may be larger than the area in which the align mark 380 is not disposed. Thus, the visibility of the align mark 380 can be improved.

Meanwhile, as shown in FIG. 5, at least one crack prevention line 530 may be provided outside the second inspection line 352. Here, the crack prevention line 530 may be disposed farther from the active area AA than the second inspection line 352.

The crack prevention line 530 may be disposed on the same layer as the first and second inspection lines 351 and 352, but present disclosure is not limited thereto.

A portion of the non-active area NA of the display panel 110 may be provided with a bending area. When a large external force is applied to the display panel 110 in the bending of the display panel 110, a crack may be generated in the display panel 110. The crack generated in the non-active area NA may be propagated to the active area AA, which may cause difficulty in displaying an image.

The crack prevention line 530 may serve to prevent the crack from propagating to the active area AA even if a crack occurs in the non-active area NA of the display panel 110.

In addition, the display panel 110 according to the aspect of present disclosure may further include at least one inspection line 520 disposed between the first and second inspection lines 351 and 352 disposed in the non-active area NA.

Next, the structure of the non-active area according to the aspect of present disclosure will be described in detail with reference to FIG. 6.

Figure 6:
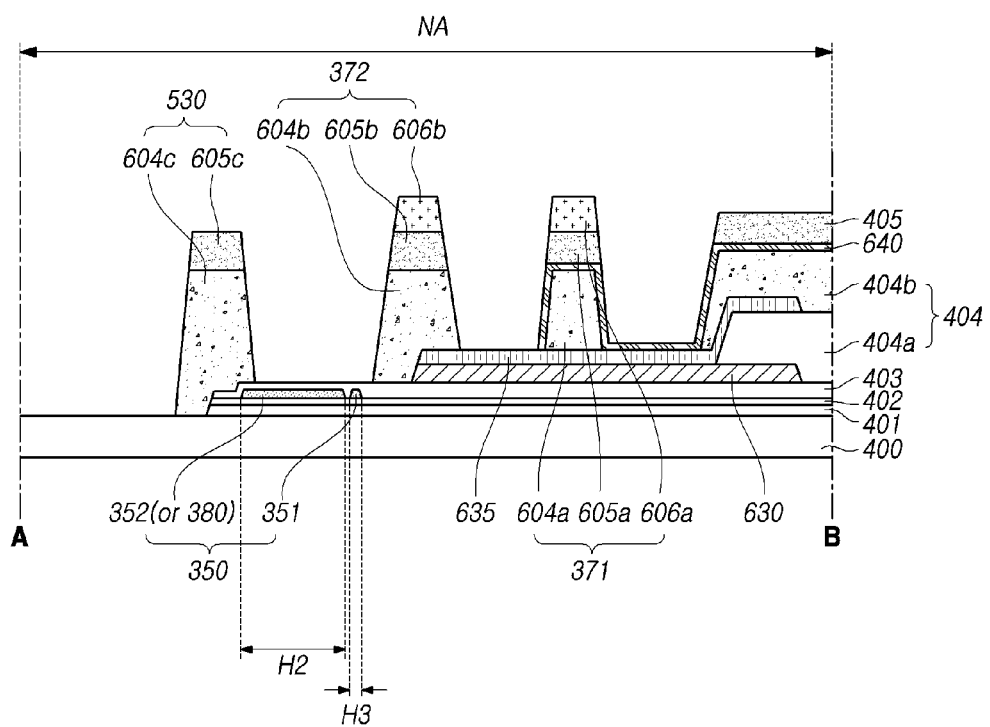
FIG. 6 is a cross-sectional view taken along line A-B of FIG. 5.

FIG. 6 is a cross-sectional view taken along line A-B of FIG. 5.

In describing the present aspect, descriptions of the same or corresponding components as the previous aspect will be omitted. Hereinafter, with reference to this, a partial structure of the non-active area of the display panel according to the present aspect will be described.

Referring to FIG. 6, in the non-active area NA of the display panel according to the aspect of the present disclosure, the inspection line 350, a plurality of signal lines 630, 635, and 640, the first and second dams 371 and 372, and the crack prevention line 530 may be disposed.

Specifically, a buffer layer 401 may be disposed on the substrate 400.

A gate insulating layer 402 may be disposed on the buffer layer 401.

The gate insulating layer 402 may include the first inspection line 351 and the second inspection line 352. Here, the second inspection line 352 may be integral with the align mark 380. The first inspection line 351 and the second inspection line 352 (or align mark) may be disposed on the same layer as the gate electrode 410 (see FIG. 4) disposed in the active area of the display panel 110. In addition, the first inspection line 351 and the second inspection line 352 (or the align mark) may include the same material as the gate electrode 410, but the present aspect is not limited thereto.

When the first inspection line 351, the second inspection line 352, and the align mark 380 are disposed on the same layer as the gate electrode 410 and contain the same material, the first inspection line 351, the second inspection line 352, the align mark 380, and the gate electrode 410 can be formed through the same process. Therefore, the process of forming the align mark 380 is simplified.

A protective layer 403 may be disposed on the substrate 400 on which the first inspection line 351 and the second inspection line 352 (or align mark) are disposed.

Here, the protective layer 403 may be in a transparent or translucent state so that the align mark 380 can be easily recognized.

A first signal line 630 may be disposed on the protective layer 403.

A first planarization layer 404a disposed to expose a portion of the upper surface of the first signal line 630 may be disposed on the first signal line 630.

A second signal line 635 in contact with the first signal line 630 may be disposed on a portion of the upper surface of the first planarization layer 404a and on the first signal line 630.

On the substrate 400 on which the second signal line 635 is disposed, the second planarization layer 404b, a first pattern 604a of the first dam 371, a first pattern 604b of the second dam 372, and a first pattern 604c of the crack prevention line 530 may be disposed.

The second planarization layer 404b, the first pattern 604a of the first dam 371, the first pattern 604b of the second dam 372, and the first pattern 604c of the crack prevention line 530 may be disposed on the same layer with each other, and may contain the same material.

Each of the second planarization layer 404b, the first pattern 604a of the first dam 371, and the first pattern 604b of the second dam 372 may be disposed to overlap with a portion of the upper surface of the second signal line 635. In addition, a hole may be provided between the second planarization layer 404b and the first pattern 604a of the first dam 371, and between the first pattern 604a of the first dam 371 and the first pattern 604b of the second dam 372.

A portion of the upper surface of the second signal line 635 may be exposed through the hole provided between the second planarization layer 404b and the first pattern 604a of the first dam 371 and between the first pattern 604a of the first dam 371 and the first patterns 604b of the second dam 372.

In addition, a hole may be provided between the first pattern 604b of the second dam 372 and the first pattern 604c of the crack prevention line 530. In addition, the first inspection line 351 and the second inspection line 352 (or an align mark) may be disposed in an area corresponding to an area between the first pattern 604b of the second dam 372 and the first pattern 604c of the crack prevention line 530.

Here, since the second inspection line 352 is integrally formed with the align mark 380, a first width H2 of the second inspection line 352 may be larger than the width H3 of the first inspection line 351.

A third signal line 640 may be disposed on the second planarization layer 404b, the second signal line 635, and the first pattern 604a of the first dam 371. The third signal line 640 may be in contact with the second signal line 635 at the area corresponding to the area where the hole provided between the second planarization layer 404b and the first pattern 604a of the first dam 371 is located.

In addition, the third signal line 640 may be disposed to surround the upper surface and side surface of the first pattern 604a of the first dam 371, but the structure of the present aspect is not limited thereto. The third signal line 640 may be disposed to overlap a portion of the surface of the second signal line 635 third signal line 640, or may be disposed in a portion of the upper surface of the second signal line 635.

In other words, in the present aspect, a structure in which the third signal line 640 is in contact with the second signal line 635 at an area corresponding to an area where the hole provided between the second planarization layer 404b and the first pattern 604a of the first dam 371 is located is enough.

The first to third signal lines 630, 635, and 640 may be lines electrically connecting the pad area PAD disposed in the non-active area NA and the sub-pixel SP of the active area AA.

For example, the first signal line 630 may be a signal line to which a power voltage is applied from the pad 360 of the pad area PAD.

The second signal line 635 may be configured to be disposed on the same layer as the auxiliary electrode disposed in the active area AA, and is a signal line electrically connected to the first signal line 630. In addition, the third signal line 640 may be configured to be disposed on the same layer as the first electrode 440 of the organic light emitting diode (OLED), and is a signal line electrically connected to the first and second signal lines 630 and 635.

A bank 405 may be disposed on the third signal line 640 disposed on the second planarization layer 404b. In addition, the second pattern 605a of the first dam 371 may be disposed on the third signal line 640 disposed on the first pattern 604a of the first dam 371. In addition, the second pattern 605b of the second dam 372 is disposed on the first pattern 604b of the second dam 372, and the second pattern 605c of the crack prevention line 530 may be disposed on the first pattern 604c of the crack prevention line 530.

The bank 405, the second pattern 605a of the first dam 371, the second pattern 605b of the second dam 372, and the second pattern 605c of the crack prevention line 530 may be disposed on the same layer, may contain the same material, but the present aspect is not limited thereto.

In addition, the third pattern 606a of the first dam 371 is disposed on the second pattern 605a of the first dam 371, and the third pattern 606b of the second dam 372 may be disposed on the second pattern 605b of the second dam 372.

The third pattern 606a of the first dam 371 and the third pattern 606b of the second dam 372 may be disposed on the same layer as the spacer 480 disposed in the active area AA, and may contain the same material, but the present aspect is not limited thereto.

The first and second dams 371 and 372 having the above-described structure may serve to prevent the material of the second encapsulation layer 492 from flowing to the pad area PAD.

Meanwhile, in FIG. 5, the shape of the align mark 380 is mainly described based on a structure having a shape such as 凹, but the shape of the align mark 380 of present disclosure is not limited thereto.

Figure 7:
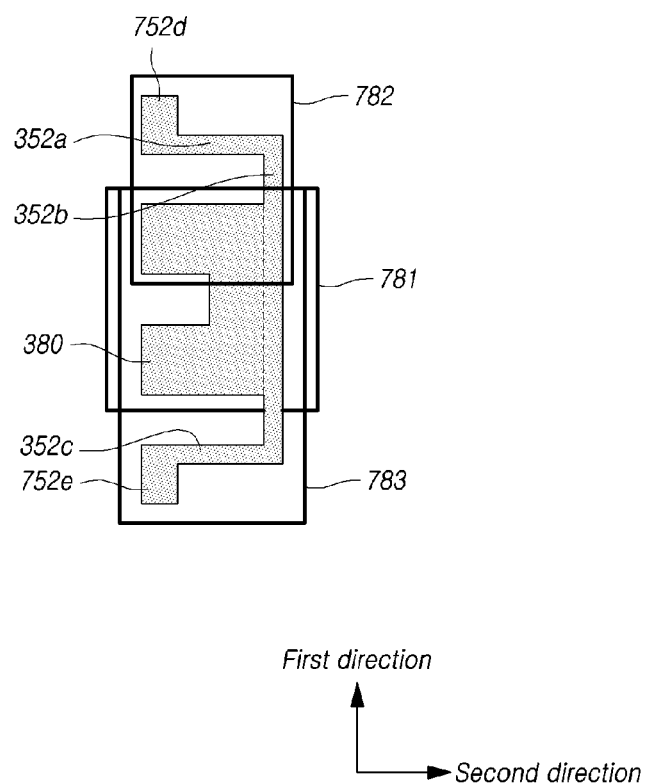
FIG. 7 is an enlarged view of area Z of FIG. 3.

FIG. 7 is an enlarged view of the area Z of FIG. 3.

In describing the present aspect, description of the same or corresponding component as the previous aspect will be omitted. Hereinafter, with reference to this, a partial structure of the non-active area of the display panel according to the present aspect will be described.

The align mark 380 for aligning the display panel 110 and other components disposed in the upper and lower portions of the display panel 110 has a shape in which a portion having an angle of 90 degrees or more exists.

The second inspection line 352 disposed in the non-active area NA may include first to third portions 352a, 352b, and 352c, as described with reference to FIG. 5. In addition, the second inspection line 352 may include a fourth portion 752d extended in the first direction from the first portion 352a and a fifth portion 752e extended in the first direction from the third portion 352c.

The second inspection line 352 having such a shape may be integrally formed with an align mark in a plurality of areas.

For example, the second inspection line 352 may be integral with the first align mark 781. Here, the first align mark 781 may have a structure included from the align mark 380 of FIG. 5 to the second portion 352b of the second inspection line 352.

In addition, the second inspection line 352 may be integral with the second align mark 782. Here, the second align mark 782 may include the first portion 352a of the second inspection line 352, a portion of the fourth portion 752d, a portion (including a portion connected to the first portion 352a) of the second portion 352b, and the align mark 380 of FIG. 5 that is integral with a portion of the second portion 352b.

In addition, the second inspection line 352 may be integral with the third align mark 783. Here, the third align mark 783 may include the third portion 352c of the second inspection line 352, a portion of the fifth portion 752e, a portion (including a portion connected to the third portion 352c) of the second portion 352b, and the align mark 380 of FIG. 5 that is integral with a portion of the second portion 352b.

In other words, the shape of the align mark of present disclosure may be variously formed, and the first to third align marks 781, 782, and 783 have a shape in which a large number of portions having an angle of 90 degrees or more exist on a plane. Accordingly, the display panel 110 according to aspects of present disclosure may include an align mark having high visibility.

According to the above-described aspects of present disclosure, at least one inspection line and align mark disposed in the non-active area are integrally formed, thereby minimizing the area occupied by the align mark in the non-active area.

In addition, according to the above-described aspects of the present disclosure, at least one inspection line and align mark disposed in the non-active area are integrally formed, thereby simplifying the process of forming the align mark.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device comprising:
   a display panel including an active area and a non-active area surrounding the active area on a substrate;
   a front cover disposed in an upper portion of the display panel;
   a back cover disposed in a lower portion of the display panel;
   a dam disposed to surround an outer periphery of the active area in the non-active area of the display panel;
   a pad area spaced apart from the dam in the non-active area and disposed in an edge of one side of the non-active area;
   at least one inspection line spaced apart from the dam in the non-active area and disposed to surround a portion of an outer periphery of the dam; and
   at least one align mark integral with the inspection line and disposed in the non-active area located outside the active area in close proximity to an edge of the display panel,
   wherein the at least one align mark has first, second and third portions and the second portion disposed between the first and third portions has a height lower than those of the first and third portions.

2. The display device of claim 1, further comprising a plurality of pads disposed in the pad area and electrically connected to the at least one inspection line.

3. The display device of claim 1, wherein the at least one inspection line comprises a first inspection line disposed to surround the portion of the outer periphery of the dam and a second inspection line spaced apart from the first inspection line and disposed to surround an outer periphery of the first inspection line.

4. The display device of claim 3, wherein the at least one align mark is integral with the second inspection line.

5. The display device of claim 3, wherein the non-active area comprises at least one crack prevention line disposed in an outer periphery of the second inspection line.

6. The display device of claim 3, further comprising at least one thin film transistor disposed on the substrate of the active area.

7. The display device of claim 6, wherein the at least one thin film transistor comprises a gate electrode, an active layer, a source electrode, and a drain electrode disposed on the substrate, and the first inspection line and the second inspection line are disposed on a same layer as the gate electrode.

8. The display device of claim 7, wherein the at least align mark is disposed on a same layer as the gate electrode of the thin film transistor.

9. The display device of claim 3, wherein the second inspection line comprises at least one groove.

10. The display device of claim 9, wherein the at least one groove of the second inspection line comprises a first portion extended in a first direction, a second portion extended in a second direction intersecting the first direction in from the first portion, and a third portion extended in a direction corresponding to a direction in which the first portion is extended in from the second portion.

11. The display device of claim 9, wherein the at least align mark is integral with at least one of the first to third portions of the second inspection line.

12. The display device of claim 9, wherein a width of the align mark with respect to a direction in which a long short side of the display panel is extended corresponds to a depth of the groove, or is wider than the depth of the groove.

13. The display device of claim 1, wherein a maximum width of the at least one align mark with respect to a direction in which a short side of the display panel is extended is larger than a maximum width of a signal line disposed in the non-active area.

14. The display device of claim 1, wherein the at least one align mark comprises at least two portions having an angle of 90 degrees or higher.

15. A display panel comprising:
   a substrate including an active area and a non-active area surrounding the active area;
   a dam disposed to surround an outer periphery of the active area in the non-active area of the substrate;
   a pad area spaced apart from the dam in the non-active area and disposed in an edge of one side of the non-active area;
   at least one inspection line spaced apart from the dam in the non-active area and disposed to surround a portion of an outer periphery of the dam; and
   at least one align mark integral with the inspection line and disposed in the non-active area located outside the active area in close proximity to an edge of the display panel,
   wherein the at least one align mark has first, second and third portions and the second portion disposed between the first and third portions has a height lower than those of the first and third portions.

16. The display device of claim 15, wherein the at least one groove of the second inspection line comprises a first portion extended in a first direction, a second portion extended in a second direction intersecting the first direction in from the first portion, and a third portion extended in a direction corresponding to a direction in which the first portion is extended in from the second portion.

17. The display device of claim 15, wherein the at least align mark is integral with at least one of the first to third portions of the second inspection line.

18. The display device of claim 15, wherein a width of the align mark with respect to a direction in which a long short side of the display panel is extended corresponds to a depth of the groove, or is wider than the depth of the groove.

19. A display panel comprising:
   a substrate including an active area and a non-active area surrounding the active area;
   a dam disposed to surround an outer periphery of the active area in the non-active area of the substrate;
   a pad area spaced apart from the dam in the non-active area and disposed in an edge of one side of the non-active area;
   a first inspection line disposed to surround the portion of the outer periphery of the dam and a second inspection line spaced apart from the first inspection line and disposed to surround an outer periphery of the first inspection line;
   at least one align mark integral with the second inspection line and disposed in the non-active area located outside the active area in close proximity to an edge of the display panel, wherein the second inspection line comprises at least one groove, and the align mark is disposed in the at least one groove of the second inspection line; and at least one crack prevention line disposed in an outer periphery of the second inspection line and on the same layer as the first inspection line and the second inspection line.

* * * * *